United States Patent

Easter et al.

[11] Patent Number: 6,150,271
[45] Date of Patent: Nov. 21, 2000

[54] DIFFERENTIAL TEMPERATURE CONTROL IN CHEMICAL MECHANICAL POLISHING PROCESSES

[75] Inventors: William Graham Easter; John Albert Maze, III; Yaw Samuel Obeng, all of Orlando, Fla.

[73] Assignee: Lucent Technologies Inc., Murray Hill, N.J.

[21] Appl. No.: 09/151,077

[22] Filed: Sep. 10, 1998

[51] Int. Cl.[7] .................................................. H01L 21/302
[52] U.S. Cl. ........................ 438/692; 438/690; 438/691
[58] Field of Search ................................. 438/690, 691, 438/692

[56] References Cited

U.S. PATENT DOCUMENTS 6,020,262   3/1998   Wise et al. ............................... 438/691

OTHER PUBLICATIONS

Wolf, silicon Processing for the VLSI Era: vol. 2 Process Integration, Lattice Press, p. 227, 238–239, 1990.

*Primary Examiner*—Tuan H. Nguyen
*Assistant Examiner*—Lisa Kilday
*Attorney, Agent, or Firm*—Thomas, Kayden, Horstemeyer & Risley LLP

[57] ABSTRACT

The specification describes a method and apparatus for chemical-mechanical polishing (CMP) to produce planar layered semiconductor structures. Non-uniformities in polishing behavior due to radial temperature variations across the semiconductor wafer are compensated by locally controlling the temperature of the wafer. Heating/cooling is implemented by installing temperature controlling coils in the head of the wafer carrier.

5 Claims, 4 Drawing Sheets

DIFFERENTIAL TEMPERATURE CONTROL IN CHEMICAL MECHANICAL POLISHING PROCESSES

FIELD OF THE INVENTION

This invention relates to chemical-mechanical polishing (CMP) processes.

BACKGROUND OF THE INVENTION

Chemical-mechanical polishing is used increasingly as a planarizing technique in the manufacture of VLSI integrated circuits. It has potential for planarizing a variety of materials in IC processing but is used most widely for planarizing metallization layers and interlevel dielectrics on semiconductor wafers, and for planarizing substrates for shallow trench isolation.

In trench isolation, large areas of field oxide must be polished to produce a planar starting wafer. Integrated circuits that operate with low voltages, i.e. 5 volts or less, and with shallow junctions, can be isolated effectively with relatively shallow trenches, i.e. less than a micron. In shallow trench isolation (STI) technology, the trench is backfilled with oxide and the wafer is planarized using CMP. The result is a more planar structure than is typically obtained using LOCOS, and the deeper trench (as compared with LOCOS) provides superior latch up immunity. Also, by comparison with LOCOS, STI substrates have a much reduced "birds' beak" effect and thus theoretically provide higher packing density for circuit elements on the chips. The drawbacks in STI technology to date relate mostly to the planarizing process. Achieving acceptable planarization across the full diameter of a wafer using traditional etching processes has been largely unsuccessful. By using CMP, in which the wafer is polished using a mechanical polishing wheel and a slurry of chemical etchant, unwanted oxide material is successfully removed with a high degree of planarity.

In multilevel metallization processes, each level in the multilevel structure contributes to irregular topography. In three or four level metal processes, the topography can be especially severe and complex. The expedient of planarizing the interlevel dielectric layers, as the process proceeds, is now favored in many state of the art IC processes.

Planarity in the metal layers is a common objective, and is promoted by using plug interlevel connections. A preferred approach to plug formation is to blanket deposit a thick metal layer on the interlevel dielectric and into the interlevel windows, and then remove the excess using CMP.

Thus, in a typical case, CMP is used for polishing an oxide, such as $SiO_2$, $Ta_2O_5$, $W_2O_5$. It can also be used to polish nitrides such as $Si_3N_4$, TaN, TiN, and conductor materials used for interlevel plugs, e.g. W, Ti, TiN.

Since CMP is at least partly an abrading process, friction between the polishing wheel and the substrate causes heating. In some cases the heating may be substantial, and may cause undesirable process variations. The chemical parameters in the process, e.g. etch rates, vary with temperature. Some CMP processes, e.g. tungsten CMP, are exothermic, which may further aggravate heating problems. Significant temperature variations across the wafer surface during polishing therefore may result in uneven polishing, and unacceptable variations in the thickness of the polished layers.

It has been proposed to control the temperature of the polishing platen to control excessive heating. However, this proposal does not address, and cannot solve, problems due to temperature variations across the surface of the substrate being polished.

SUMMARY OF THE INVENTION

We have developed an improved CMP process for semiconductor wafers. The improved CMP process involves controlling temperature gradients across the wafers being polished. Control is implemented using a cooling/heating apparatus that effects local temperature control of the wafers.

DETAILED DESCRIPTION

Figure 1:
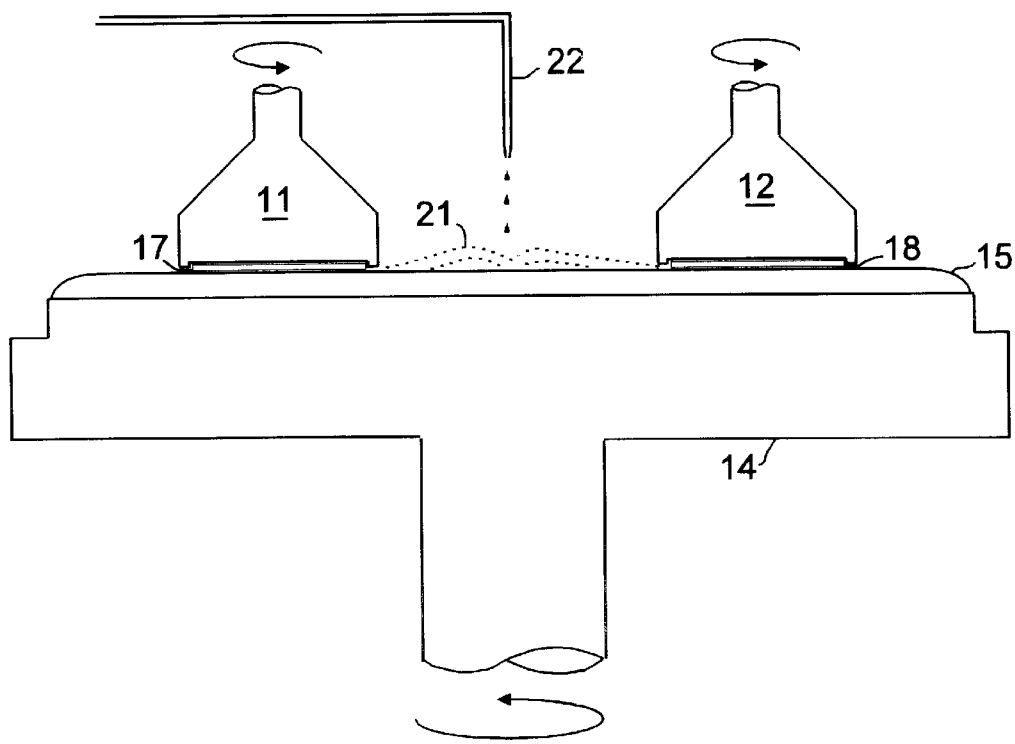
FIG. 1 is a schematic view of a CMP apparatus.

With reference to FIG. 1, two wafer carriers 11 and 12 are shown disposed over the CMP platen assembly 14. The polishing pad is shown at 15. Two wafer carriers are shown in this view as representative, but in a typical apparatus there may be a multiplicity of wafer carries, e.g. five, are arranged around a circumference of the surface of the polishing pad. Each wafer carrier supports a semiconductor wafer 17,18, and the wafers bear against the polishing pad under pressure exerted by the wafer carriers. The wafer carriers are also provided with vacuum means (not shown) so that they operate as vacuum chucks for loading wafers during the transfer process. The vacuum is usually not active during the polishing process. The wafers are rotated during polishing by rotation of the wafer carriers as schematically shown. The polishing platen is also rotated. The chemical solution, shown schematically in the figure at 21, is a mild etchant for the material being removed from the wafer, and is introduced via dispenser arm 22 from above the polishing pad onto the center of the pad, where it is distributed to the surface of the wafers by the centrifugal force of the rotating platen.

The polishing pad is typically a layered polymer material with layers of different hardness depending on the CMP process being used and the material being removed from the wafer. Polishing pads, or cloths, and suitable slurries are available from Rodel, Inc., Newark, Del.

Figure 2:
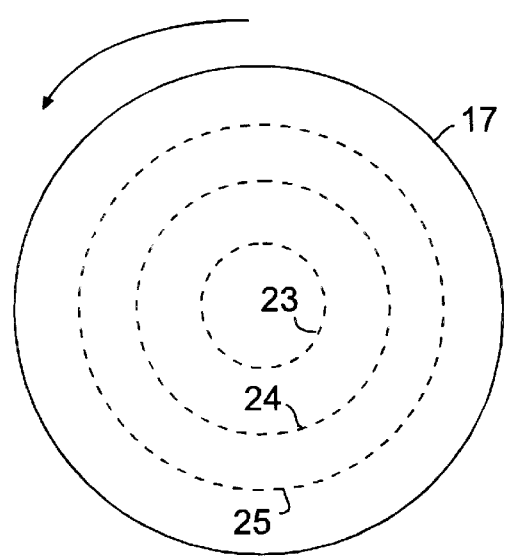
FIG. 2 is a schematic representation of typical temperature gradients in wafers being polished by CMP.

With reference to FIG. 2, a wafer 17 is shown with circumferential regions 23, 24, and 25. Based on observations of variations in polishing rates, which tend to track rings 23–25, usually in a monotonic fashion, it is concluded that the polishing rate differential is a result of temperature variations across the wafer 17 luring the polishing operation. These temperature variations may result from non-uniformities in the heat transfer characteristics of the wafer carrier, accelerated chemical reactions due to non-uniform reactant concentrations, non-uniform heating of the slurry, and non-uniform heating of the wafer itself due to differences in the amount and duration of friction generated between different parts of the wafer being polished. These effects do not necessarily have a pattern but isotherm do develop in a circular pattern due to the rotation of the wafer. The temperature gradients therefore typically have a radial pattern.

These radial temperature gradients in the wafer are reduced or largely eliminated according to the invention by providing local temperature control means in the head of the wafer carrier. The temperature control means is a heating/cooling apparatus which induces radial temperatures changes that counteract the gradients produced by the CMP apparatus. In the following discussion of the invention, reference is made for convenience to cooling means and cooling apparatus, but it will be understood that the apparatus can also be used in a heating mode if desired, and "cooling" in each case should be understood to include heating or cooling.

In one embodiment of the invention the cooling means comprise cooling coils embedded in the head of the wafer carrier adjacent to the seat of the wafer. In another embodiment thermoelectric cooling is used, and the cooling means are thermoelectric coolers arranged on or close to the seat of the wafer.

Figure 3:
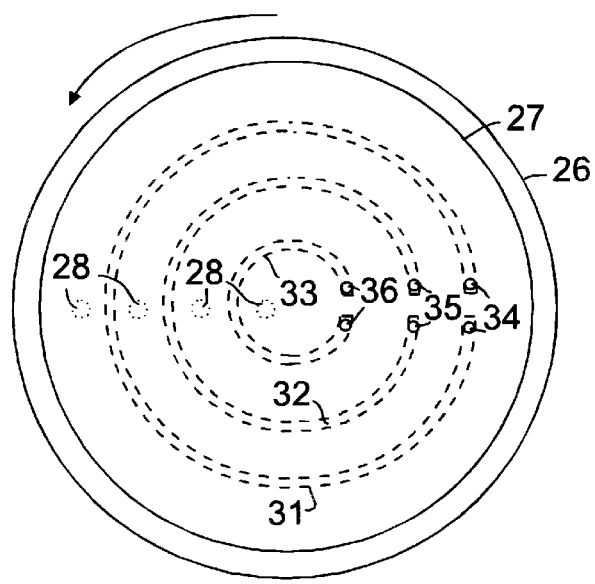
FIG. 3 is a plan view of the wafer carrier with a temperature control assembly according to the invention.

With reference to FIG. 3, a wafer carrier is shown which comprises a polishing head, indicated generally by 26, with a circular recess 27 where the wafer is seated for polishing. The wafer carrier is provided with cooling coils 31,32 and 33 embedded in the polishing head of the wafer carrier close to recess 27. The coils are provided with inlets/outlets 34, 35 and 36 to allow coolant to circulate through the coils. The coolant can be chosen from a variety of known effective heat transfer fluids, either gas or liquid. The preferred coolant is de-ionized water, which is simple and effective to use and poses no contamination threat to the wafers in the event of a leak.

The number of cooling coils, the diameter of the coils, and the placement of the coils can each be varied to produce the result desired. Optimum cooling arrangements will depend on the particular apparatus used, the size of the wafers, the thermodynamics of the process, etc. These factors can be complex and variable, and it is recommended that an empirical model be generated for a given application to determine the most effective cooling coil arrangements. In the embodiment shown here the coils are circularly symmetric, and the temperature across the surface of the wafers can be controlled effectively by varying the flow rate of coolant with each coil. A flow rate monitor and control (not shown) is provided for each coil. Thermocouples 28, located on or near the surface of the recess 27 in the wafer carrier, monitor the temperature of the wafers during polishing.

Figure 4:
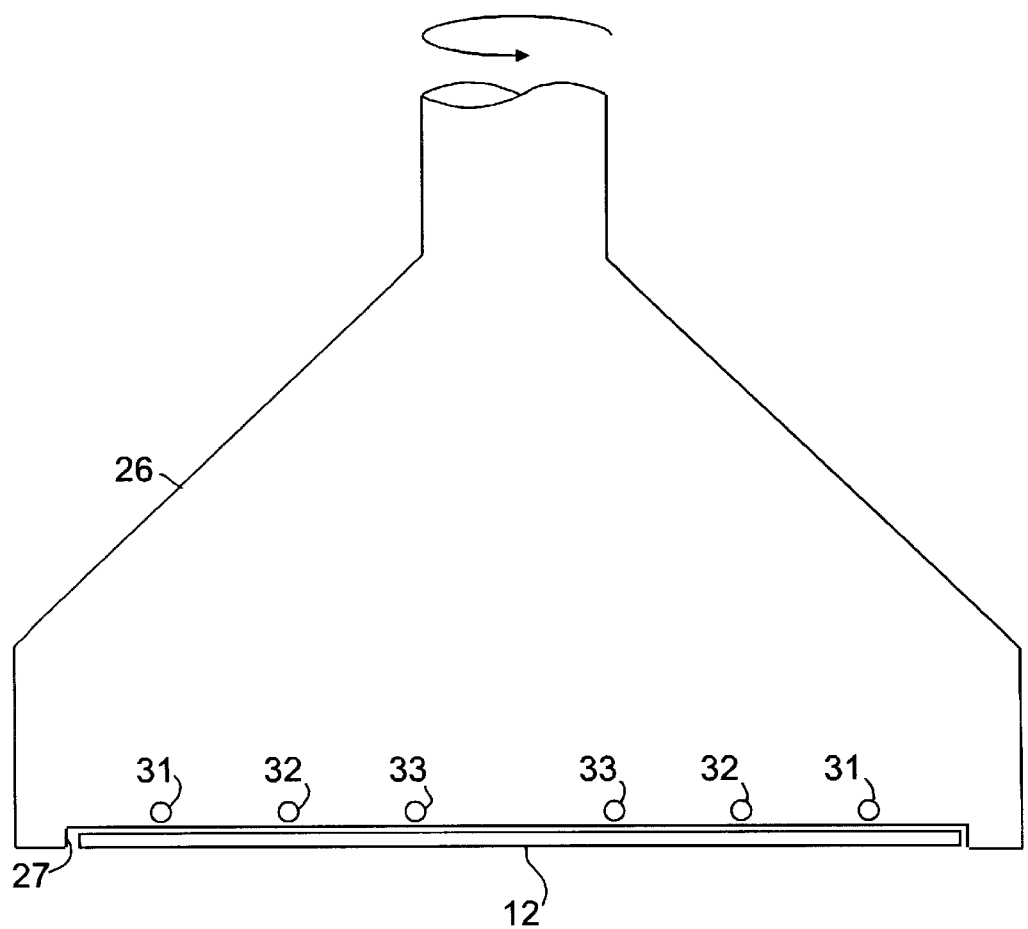
FIG. 4 is a sectional view of the wafer carrier of FIG. 3.

The wafer carrier is shown in front section in FIG. 4. The wafer carrier 26 contains cooling coils 31–33, located as close to wafer 12 as possible for effective heat transfer from wafer to the cooling fluid in the coils.

Figure 5:
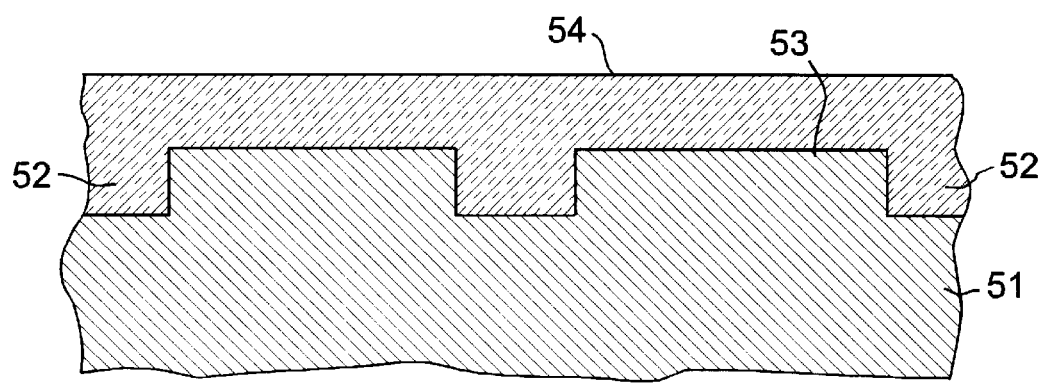
FIG. 5 is a sectional view representing a portion of a shallow trench isolated wafer prior to CMP processing.

As suggested earlier, there are a variety of important applications for CMP in the manufacture of integrated circuits. One of these, shallow trench isolation, will be described in connection with FIGS. 5 and 6. With reference to FIG. 5, a semiconductor wafer 51 is shown with shallow isolation trenches 52 etched in the substrate. The semiconductor regions 53 between the isolation trenches 52 are the active device sites. In principle, any semiconductor substrate can be isolated using shallow trenches but in the most likely commercial embodiment the substrate 51 will be silicon.

The trenches are typically of the order of 300–500 nm but could range from 200–1000 nm depending on the technology being used. The x-y dimensions of the isolation trenches depends on the portion of the field oxide of the integrated circuit that is being viewed. In the portion shown in FIG. 5 the field oxide region is relatively large compared to the active region. It is this part of the wafer to which CMP is applied to produce a planar substrate with isolated regions of silicon 53.

Figure 6:
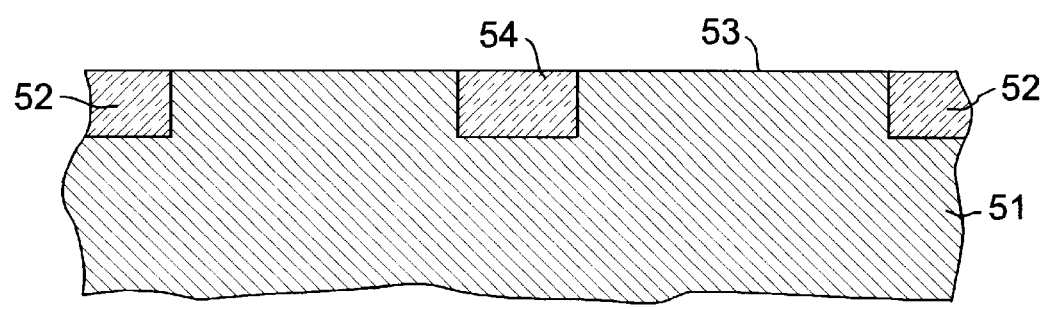
FIG. 6 is a view of the wafer of FIG. 5 after CMP processing according to the invention.

The CMP step is then performed to produce the planar substrate shown in FIG. 6. A suitable polish slurry is XSHD3562, available from Rodel, Inc. The CMP proceeds by eroding the fill oxide 54 from the high sites over the active device areas, while the field oxide 54 in the trenches remains intact due to the planarity of the CMP process. If the polish rates are not adequately controlled, some of the active regions will be exposed before others, resulting in some sites that are still coated, or, if polishing proceeds to bare these sites, other sites that are eroded excessively. On completion of the CMP step, the active device regions are ready for device fabrication.

Figure 7:
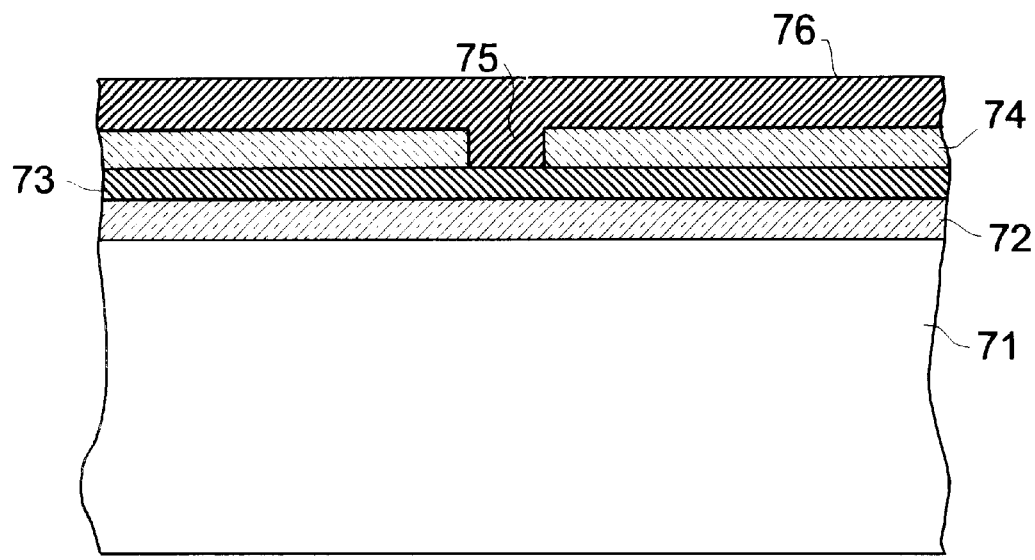
FIG. 7 is a sectional view prior to CMP of a wafer with an interlevel dielectric layer and a metal layer for forming window plugs in the interlevel dielectric layer.
Figure 8:
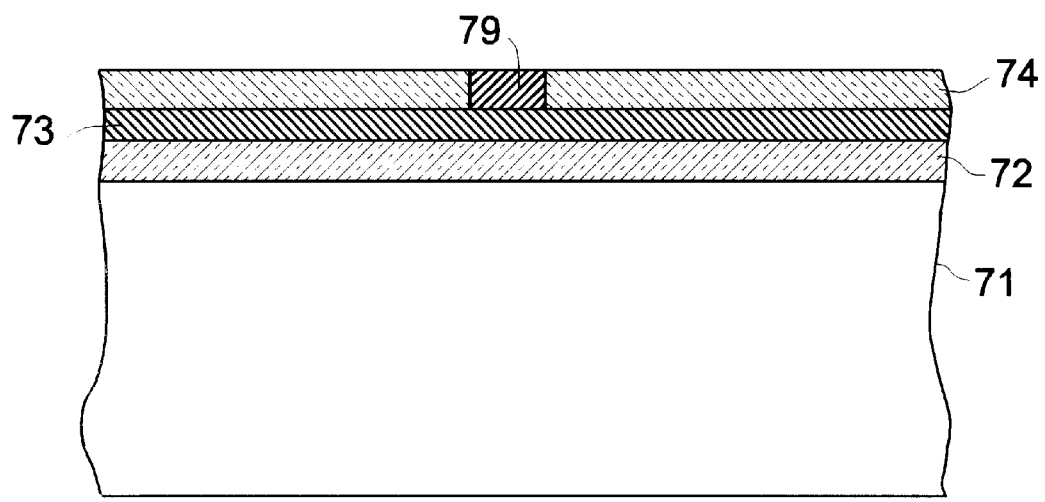
FIG. 8 is a sectional view of the wafer of FIG. 7 after CMP according to the invention.

Another application of the invention is the planarizing of a metal layer to form interlevel plugs for interconnections between metal levels, and will be described in conjunction with FIGS. 7 and 8. In complex integrated circuits, three or more metal levels may be used. In the illustration given here, only one metal level is shown for simplicity. With reference to FIG. 7, a substrate 71, usually silicon, is shown covered with a first dielectric layer 72 and a first metal layer 73. In typical silicon gate MOS processing, the first dielectric layer is a grown field oxide, and the first metal level is polysilicon. The first interlevel dielectric layer 74 is then deposited over the first metal layer. A window 75 is formed in the first interlevel dielectric for interconnection between metal one and metal two. The window is formed by conventional lithography, which is typically photolithography, but may be x-ray or e-beam lithography. The layer 76 which is to form the interlevel plug in window 75 is then deposited. The window is frequently lined with a barrier material, e.g. Ti/TiN (not shown), and the plug material may be e.g. W. The thickness of layer 76 is greater than the depth of window 75 to ensure that the window is filled. Excess metal is then removed using CMP, as described above, to produce the structure shown in FIG. 8. The window is now plugged with metal plug 79, and the structure is ready for deposition of the metal 2 layer. As will be appreciated, removal of the excess metal by the CMP step of FIG. 8 results in a more planar structure, especially in cases where this sequence is repeated several times.

In a general sense, the invention is applicable to polishing a layer of insulating or conductive material in the manufacture of semiconductor integrated circuits. The term polishing refers to a process in which at least 25% of the thickness of the layer is removed in selected portions of the layer. In many CMP applications, such as those described above, essentially all of the thickness of the layer in selected portions will be removed.

The layer being polished is also typically deposited on a non-planar substrate and therefore, depending on the degree of conformality of the deposition process, the top surface of the layer may also be non-planar. The bottom surface of the layer will necessarily be non-planar, with high regions and low regions. For the purpose of defining this invention, the height of the high regions (as measured from the surface of the semiconductor wafer) exceeds the height of the low regions by at least 25% of the thickness of the layer. Expressed as a formula, if the layer has a thickness T, then the height $h_1$ of the high regions of the layer is related to the height $h_2$ of the low regions by:

$$h_1 > h_2 + T/4$$

To ensure a common reference point the height dimension in the above relationship is measured from the surface of the planar semiconductor wafer to the bottom surface of the layer being polished. The semiconductor wafer is typically planar to a value of the order of ±1.5%.

The terms cylindrical and circular are used herein as referring to various components and elements. When used in conjunction with a semiconductor wafer it will be understood by those skilled in the art that semiconductor wafers may not be completely circular. Wafers typically have a "flat" for handling and alignment purposes, and some equipments used for processing wafers have a corresponding flat. Therefore the terms essentially circular or essentially cylindrical are intended to account for this.

For the invention to be effective it is important that the cooling means be selectively applied to parts of the polishing head in order to selectively control the temperature gradients on the wafer. Accordingly, the cooling means should provide means for adjusting the temperature of one part of the polishing head by at least 1° C. with respect to another part of the polishing head.

Reference to fluids used in the cooling or heating coils of the invention refers to liquids or gases.

The temperature control means of the invention can also be used to advantage to elevate or lower the overall temperature of the polishing head. In some cases uniform heating of the polishing head will increase the overall rate of the CMP process. Uniform cooling of the polishing head can be used to decrease the overall rate of polishing for added control of the CMP process.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A process for the manufacture of semiconductor integrated circuits comprising the steps of:
   a. producing a semiconductor substrate by forming at least one layer on a planar semiconductor wafer,
   b. depositing a layer of material on said semiconductor substrate, said layer having a top surface, a bottom surface, and a thickness T, said bottom surface of said layer having high regions with a height $h_1$ as measured from the surface of said wafer, and low regions with a height $h_2$ as measured from the surface of said wafer, wherein:

$$h_1 > h_2 + T/4$$

c. removing at least part of said layer in said high regions by the steps of:
      i. mounting the substrate on a wafer carrier,
      ii. rotating the wafer carrier,
      iii. positioning the wafer carrier above a rotating polishing platen so that the substrate contacts the polishing platen,
      iv. introducing a chemical etchant onto the polishing platen and into contact with the substrate whereby a temperature differential of at least 1° C. results between first portions of the substrate and second portions of the substrate,
   d. measuring the temperature differential between the first and second portions of the substrate, and
   e. in response to the step of measuring the temperature differential, selectively cooling one of the first or second portions of the substrate with respect to the other to reduce the temperature differential between the first and second portions of the substrate.

2. The process of claim 1 wherein at least one temperature control coil is provided adjacent the substrate and the temperature of the substrate is controlled by passing a fluid through said coil.

3. The process of claim 1 wherein the temperature of the substrate is measured at several positions on the substrate.

4. The process of claim 1 wherein the semiconductor is silicon.

5. A process for the manufacture of semiconductor integrated circuits comprising the steps of:
   a. producing a semiconductor substrate by forming at least one layer on a planar semiconductor wafer,
   b. depositing a layer of material on said semiconductor substrate, said layer having a top surface, a bottom surface, and a thickness T, said bottom surface of said layer having high regions with a height $h_1$ as measured from the surface of said wafer, and low regions with a height $h_2$ as measured from the surface of said wafer, wherein:

$$h_1 > h_2 + T/4$$

c. removing at least part of said layer in said high regions by the steps of:
      i. mounting the substrate on a wafer carrier,
      ii. rotating the wafer carrier,
      iii. positioning the wafer carrier above a rotating polishing platen so that the substrate contacts the polishing platen,
      iv. introducing a chemical etchant onto the polishing platen and into contact with the substrate,
   d. measuring the temperature of the substrate, and
   e. in response to the step of measuring the temperature of the substrate, uniformly cooling the entire substrate by passing a fluid through at least one temperature control coil located adjacent the substrate.

* * * * *